(12) United States Patent
Lang et al.

(10) Patent No.: US 9,520,575 B2
(45) Date of Patent: Dec. 13, 2016

(54) ORGANIC LIGHT-EMITTING COMPONENT AND USE OF A COPPER COMPLEX IN A CHARGE TRANSPORT LAYER

(75) Inventors: Erwin Lang, Regensburg (DE); Christian Kristukat, Caba (AR)

(73) Assignee: OSRAM OLED GmbH, Regensburg (DE)

( * ) Notice: Subject to any disclaimer, the term of this patent is extended or adjusted under 35 U.S.C. 154(b) by 757 days.

(21) Appl. No.: 13/993,662

(22) PCT Filed: Nov. 24, 2011

(86) PCT No.: PCT/EP2011/070934
§ 371 (c)(1),
(2), (4) Date: Aug. 24, 2013

(87) PCT Pub. No.: WO2012/079956
PCT Pub. Date: Jun. 21, 2012

(65) Prior Publication Data
US 2013/0334519 A1  Dec. 19, 2013

(30) Foreign Application Priority Data
Dec. 13, 2010  (DE) .................. 10 2010 062 877

(51) Int. Cl.
*H01L 51/54* (2006.01)
*H01L 51/50* (2006.01)
*H01L 51/00* (2006.01)

(52) U.S. Cl.
CPC ....... *H01L 51/5048* (2013.01); *H01L 51/0091* (2013.01); *H01L 51/506* (2013.01); *H01L 51/5024* (2013.01); *H01L 51/5052* (2013.01); *H01L 51/0059* (2013.01)

(58) Field of Classification Search
None
See application file for complete search history.

(56) References Cited

U.S. PATENT DOCUMENTS 6,541,909 B1 * 4/2003 Motomatsu ......... H01L 51/5012
313/504
2004/0086745 A1  5/2004 Iwakuma et al.
2010/0164842 A1  7/2010 Ishihara et al.
2011/0089408 A1  4/2011 Schmid et al.
2013/0099209 A1 * 4/2013 Hartmann ............. C09K 11/06
257/40
2013/0334519 A1 * 12/2013 Lang ................... H01L 51/5048
257/40

FOREIGN PATENT DOCUMENTS

| CN | 102576802 A | 7/2012 |
|---|---|---|
| DE | 101 35 513 A1 | 2/2003 |
| DE | 10 2004 010 954 A1 | 10/2005 |
| JP | 2008270674 A | 11/2008 |
| JP | 2010153284 A | 7/2010 |
| JP | 2010186809 A | 8/2010 |
| WO | WO 2011/033023 A1 | 3/2011 |

OTHER PUBLICATIONS

Sevryugina, Y., et al., "Tetranuclear copper(I) clusters: impact of bridging carboxylate ligands on solid state structure and photoluminescence," Journal of Chemical Communications, No. 37, Jul. 18, 2007, pp. 3853-3855.

Sevryugina, Y., et al., "X-ray structure and photoluminescence of copper(I) 2,6-bis(trifluoromethyl)benzoate," Inorganica Chimica Acta, vol. 360, No. 9, Jun. 10, 2007, pp. 3103-3107.

Sharma, R.P., et al., "Segregated aromatic Π-Π stacking interactions involving fluorinated and non-fluorinated benzene rings: $Cu(py)_2(pfb)_2$ and $Cu(py)_2(pfb)_2(H_2O)$ (py = pyridine and pfb = pentafluorobenzoate)," Journal of Fluorine Chemistry, No. 131, 2010, pp. 456-460.

* cited by examiner

*Primary Examiner* — Marc Zimmer
(74) *Attorney, Agent, or Firm* — Slater Matsil, LLP

(57) ABSTRACT

An organic light-emitting component has an active layer for emitting electromagnetic radiation. It also has an anode and an organic charge transport layer, arranged between the active layer and the anode, for transporting charge carriers from the anode to the active layer. The anode can be used to decouple electromagnetic radiation emitted by the active layer from the organic light-emitting component. The organic charge transport layer comprises a copper complex which has at least one ligand with the chemical structure as per a formula I.

13 Claims, 1 Drawing Sheet

ORGANIC LIGHT-EMITTING COMPONENT AND USE OF A COPPER COMPLEX IN A CHARGE TRANSPORT LAYER

This patent application is a national phase filing under section 371 of PCT/EP2011/070934, filed Nov. 24, 2011, which claims the priority of German patent application 10 2010 062 877.8, filed Dec. 13, 2010, each of which is incorporated herein by reference in its entirety.

TECHNICAL FIELD

The present invention relates to an organic, light-emitting component and also to the use of a copper complex in a charge transport layer of an electronic component with transparent anode contact.

BACKGROUND

An optoelectronic component is designed for converting electrical energy into electromagnetic radiation, such as into the visible light, for example, or for the reverse process. Reference may be made in each case to an emitter device or a detector device. One example of an electromagnetic component in the form of an emitter device is a light-emitting component, more particularly a light-emitting diode (LED). The light-emitting component typically comprises electrodes with an active zone disposed between them. Via the electrodes, the light-emitting component can be supplied with an electric current which in the active zone is converted into optical energy, i.e., electromagnetic radiation. The optical energy is outcoupled from the light-emitting component via a radiation outcoupling area.

One particular light-emitting component is the organic, light-emitting component (Organic Light Emitting Device or OLED). An OLED has an organic layer in the active layer in order to convert electrical energy into electromagnetic radiation. When the OLED is contacted with a current source via the electrodes, different types of charge carrier are injected into the organic layer. Positive charge carriers, also referred to as holes, migrate from the anode toward the cathode through the organic layer, while electrons migrate through the organic layer from the cathode toward the anode. In the course of this process, excitation states develop in the organic layer, in the form of electron-hole pairs, known as excitons, which decompose with emission of electromagnetic radiation. An organic light-emitting component of this kind is known from German Patent Publication No. 101 35 513 A1, for example.

The electromagnetic radiation emitted from the organic layer is outcoupled from the OLED via at least one of the electrodes, in other words via the anode or via the cathode. Correspondingly, the electrode must be transparent in respect of the emitted radiation—that is, it must have a high transmission coefficient for the electromagnetic radiation. For electromagnetic radiation in the visible light range, for example, thin metal films (TMFs) based on silver (Ag), gold (Au), or magnesium (Mg) are used for a transparent electrode material. Also possible is the use of transparent conductive oxides (TCOs) as electrode material, such as indium tin oxide (ITO) or aluminum-doped zinc oxide (AZO), for example. Further conceivable are composite electrodes which have a layer stack composed of TMFs and/or TCOs, for example.

In order to inject the charge carriers from the electrode into the active layer, it is common to provide interlayers which bring about charge carrier transport from the electrode into the active layer. A charge transport layer of this kind is desirable in particular on the anode side, in order to boost the injection of holes into the active layer. The charge transport layer provided on the anode side is also referred to as a hole transport layer (HTL). A thick HTL has the advantage, in the operation of the OLED, of suppressing spontaneous short circuits, where electrons—without being combined with holes in the active layer to form excitons—cross the organic layer and reach the anode directly. To be able to ensure the performance of OLED components having a thick HTL, in respect of efficiency or else lifetime, for example, it is advantageous if the relatively thick charge transport layer between anode and active layer is preferably transparent.

SUMMARY OF THE INVENTION

Embodiments of the present invention provide an OLED in which intrinsically generated light can be efficiently outcoupled via the anode, the OLED being distinguished by a high level of voltage stability.

BRIEF DESCRIPTION OF THE DRAWINGS

One working example of the organic, light-emitting component is elucidated in more detail below with reference to the drawing. In the figures.

DETAILED DESCRIPTION OF ILLUSTRATIVE EMBODIMENTS

Exemplary Embodiments

Figure 1:
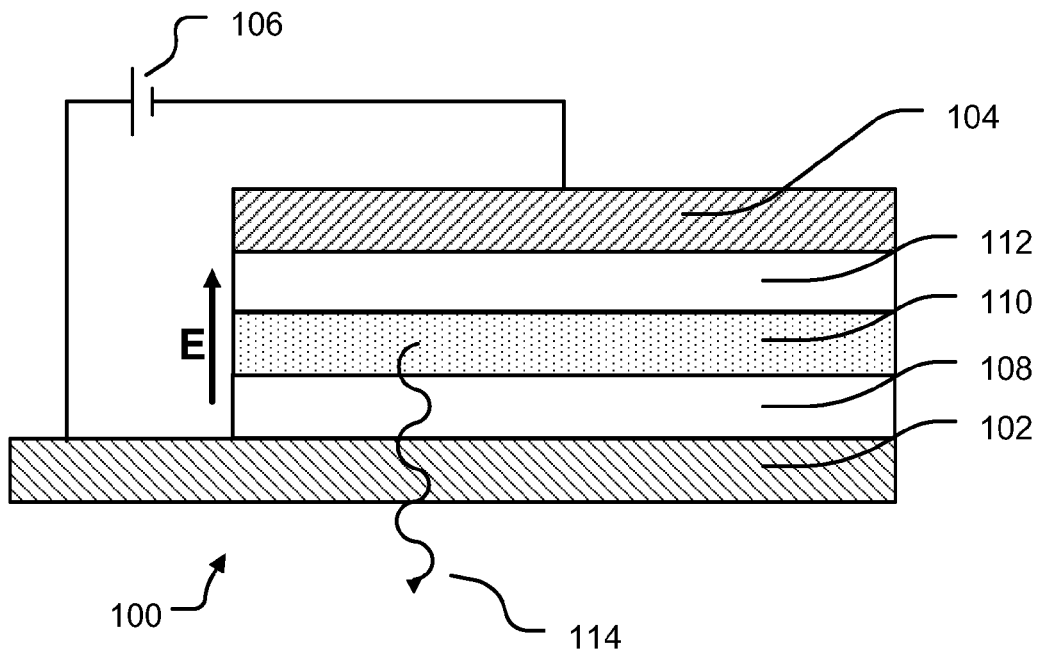
FIG. 1 shows a diagrammatic representation of a first working example of an organic light-emitting component.

The various configurations of the embodiments described below apply equally, insofar as they can be employed analogously, to the organic light-emitting component and to the use of the copper complex in an organic layer structure.

Different embodiments of the organic light-emitting component have an active layer for the emission of electromagnetic radiation, an anode, and, disposed between the active layer and the anode, an organic charge transport layer for charge carrier transport from the anode into the active layer. Radiation emitted from the active layer can be outcoupled from the organic light-emitting component via the anode. The organic charge transport layer has a copper complex with at least one ligand with the chemical structure according to formula I:

$E_1$ and $E_2$ are in each case independently of one another one of the following elements: oxygen, sulfur, or selenium. R is selected from the following group: hydrogen or substituted or unsubstituted, branched, linear, or cyclic hydrocarbons.

The charge transport layer may be a p-doped layer, comprising the above-identified copper complex as p-dopant. The copper complex has a very good doping capacity.

It improves charge carrier transport in the charge transport layer; in particular, the conductivity of holes in the p-doped region is increased. In this way, overall, the charge transport layer is able to provide a high number of freely mobile charge carriers to the active layer, thereby producing particularly high efficiency in the organic light-emitting component. Furthermore, with the copper complex as dopant, a high level of transparency in the range of the emitted radiation can be achieved. The transmission coefficient of a matrix material doped with the dopant allows a charge transport layer to be provided that has a transmission coefficient of greater than 0.9. Conversely, the use of the copper complex as dopant thus brings about an absorption of less than 10% when the electromagnetic radiation passes through the charge transport layer.

As a result of the high transparency of the dopant it is possible to provide a thick charge transport layer between the anode and the active layer, without giving rise to high absorption losses in the charge transport layer. This increases the design freedom in the construction of a layer system in the organic light-emitting component, and more particularly the thickness of the charge transport layer can be increased with a view to voltage stability of the component, without having to accept high absorption losses.

A further advantage of the use of copper complexes is the ready availability of the starting materials and the unhazardous processing of the dopants, hence allowing an inexpensive and eco-friendly alternative to existing dopants to be utilized.

In certain embodiments the copper complex is a copper (I)pentafluorobenzoate. This complex has the following structure:

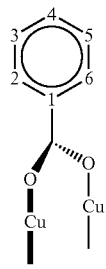

where positions 2 to 6 are occupied by fluorination. The selection of the copper(I)pentafluorobenzoate is especially advantageous because this complex entails high hole conductivity and low absorption in the visible spectral range. For a layer 100 nm thick of (4,4',4"-tris(N-(1-naphthyl)-N-phenylamino)triphenylamine that has been doped with copper(I)pentafluorobenzoate, a transmission of more than 93% above a wavelength of 420 nm has been measured.

Furthermore, copper(I)pentafluorobenzoate is particularly suitable for processing in the production of an organic light-emitting component. It has a vaporization temperature of only around 200° C. Other dopants used for p-doping, such as $V_2O_5$, $MoO_3$, $WO_3$, or F4 TCNQ (2,3,5,6-tetrafluoro-7,7,8,8-tetracyanoquinodimethane), have a substantially higher vaporization temperature. Copper(I)pentafluorobenzoate can therefore be processed without the use of special high-temperature vaporization sources.

The doping concentration of the dopant in the material may be selected optimally for the electrical conductivity and the stability of the charge transport layer. In particularly advantageous embodiments the doping concentration is between 0.1 to 50 weight percent of the charge transport layer. A figure of around 5 weight percent has proven particularly advantageous.

By means of the doping concentration it is additionally possible to raise the transparency of the charge transport layer. High transparency is necessary in order to avoid absorption losses in the charge transport layer. It is advantageous in this context to provide a particularly high doping concentration in the charge transport layer. The doping concentration ought to be at least 1, advantageously more than 10 weight percent of the charge transport layer.

In certain embodiments the charge transport layer has a doping gradient toward the active layer. This means that the concentration of the dopant changes over the cross section of the charge transport layer. Advantageously the doping of the charge transport layer decreases toward the active layer. Provided accordingly, particularly at the interface of the charge transport layer with the anode, is a high doping concentration, which allows sufficiently easy injection from the anode into the charge transport layer.

A doping gradient may be obtained, for example, by the successive application of a plurality of p-doped organic semiconductor layers. It is also conceivable to change the supply of the dopant during a production operation of the charge transport layer, by means of a suitable operation, so that as the layer thickness goes up, there is a gradually different doping present in the charge transport layer. It is also conceivable for a desired distribution of the dopant in the matrix material to be obtained by means of a suitable supply, as for example, by a beam profile when implanting the dopant.

The dopant concentration may extend, for example, from 100% on the anode side to 0% at the boundary with the active layer. On the anode side, for example, a thin dopant film is conceivable in the charge transport layer. It is additionally conceivable for different dopants to be incorporated in the charge transport layer, and for a variation in the conductivity or suitable design of the potential barriers to the anode and to the active layer to be brought about in this way.

First Working Example of an Organic, Light-Emitting Component

FIG. 1 shows a diagrammatic representation of a first working example of an organic light-emitting component 100.

The organic light-emitting component 100 has an anode 102 and a cathode 104. The anode 102 and the cathode 104 serve as electrodes of the organic light-emitting component 100. They are connected to an external current source 106—for example, to a primary battery or to a rechargeable battery. Disposed between the anode 102 and the cathode 104 is a layer stack of organic and/or inorganic semiconductor materials. The anode 102 and the cathode 104 each feature a highly conductive material which may be selected with regard to its optical properties. The anode 102 here features a transparent material. It may comprise a TMF, a TCO and/or a transparent, conductive polymer. The cathode 104 may also consist of a transparent material. It is also conceivable for the cathode 104 to consist of a highly conductive, reflecting material which comprises, for example, a metal, for instance aluminum, silver, platinum, copper, gold, or a metal alloy.

Positive charge carriers (holes) are injected into the layer stack via the anode 102, while negative charge carriers (electrons) are injected into the layer stack via the cathode 104. At the same time there is an electrical field E between the anode 102 and the cathode 104. The effect of the electrical field E is that holes injected from the anode 102 migrate through the layer stack in the direction of the cathode 104. Electrons injected from the cathode 104 migrate in the direction of the anode 102 under the influence of the electrical field E.

The layer stack features a series of different functional layers. Applied directly on the anode 102 is a hole-transporting layer 108. Applied on the hole-transporting layer 108 is an active layer 110. Disposed between the active layer 110 and the cathode 104 is an electron-transporting layer 112.

With regard to the design of the organic light-emitting component 100 it is conceivable for further functional layers to be able to be provided. These layers may serve, for example, for injection of charge carrier into adjacent layers or with regard to for improved or limited transport of charge carriers into adjacent layers. Also conceivable is the provision of layers for the provision of further charge carriers, such as a charge generation layer or CGL, for example.

Hole-Transporting Layer 108

The function of the hole-transporting layer 108 is primarily that of ensuring balanced transport of positive charge carriers into the active layer 110. The hole-transporting layer 108 may be a p-doped matrix material. The p-dopant used is a copper complex with at least one ligand with the chemical structure according to formula I:

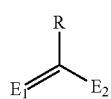

(I)

$E_1$ and $E_2$ are in each case independently of one another one of the following elements: oxygen, sulfur, or selenium. R is selected from the following group: hydrogen or substituted or unsubstituted, branched, linear, or cyclic hydrocarbons.

The following materials may be used here as part of the matrix material: NPB (N,N'-bis(1-naphthyl)-N,N'-bis(phenyl)benzidine, β-NPB (N,N'-bis(naphthalen-2-yl)-N,N'-bis(phenyl)benzidine), TPD (N,N'-bis(3-methylphenyl)-N,N'-bis(phenyl)benzidine), N,N'-bis(1-naphthyl)-N,N'-bis(phenyl)-2,2-dimethylbenzidine, spiro-TPD (N,N'-bis(3-methylphenyl)-N,N'-bis(phenyl)-9,9-spirobifluorene), spiro-NPB (N,N'-bis(1-naphthyl)-N,N'-bis(phenyl)-9,9-spirobifluorene), DMFL-TPD (N,N'-bis(3-methylphenyl)-N,N'-bis(phenyl)-9,9-dimethylfluorene, DMFL-NPB (N,N'-bis(1-naphthyl)-N,N'-bis(phenyl)-9,9-dimethylfluorene), DPFL-TPD (N,N'-bis(3-methylphenyl)-N,N'-bis(phenyl)-9,9-diphenylfluorene), DPFL-NPB (N,N'-bis(naphth-1-yl)-N,N'-bis(phenyl)-9,9-diphenylfluorene), Sp-TAD (2,2',7,7'-tetrakis(n,n-diphenylamino)-9,9'-spirobifluorene), TAPC (di[4-(N,N-ditolylamino)phenyl]cyclohexane), spiro-TTB (2,2',7,7'-tetra(N,N-ditolyl)aminospirobifluorene), BPAPF (9,9-bis[4-(N,N-bis-biphenyl-4-ylamino)phenyl]-9H-fluorene), spiro-2NPB (2,2',7,7'-tetrakis[N-naphthyl(phenyl)amino]-9,9-spirobifluorene), spiro-5 (2,7-bis[N,N-bis(9,9-spirobifluoren-2-yl)-amino]-9,9-spirobifluorene), 2,2'-spiro-DBP (2,2'-bis[N,N-bis(biphenyl-4-yl)amino]-9,9-spirobifluorene), PAPB (N,N'-bis(phenanthren-9-yl)-N,N'-bis(phenyl)benzidine), TNB (N,N,N',N'-tetranaphthalen-2-ylbenzidine), spiro-BPA (2,2'-bis(N,N-diphenylamino)-9,9-spirobifluorene), NPAPF (9,9-bis[4-(N,N-bisnaphthylamino)phenyl]-9H-fluorene), NPBAPF (9,9-bis[4-(N,N'-bisnaphth-2-yl-N,N'-bisphenylamino)phenyl]-9H-fluorene), TiOPC (titanium oxide-phthalocyanine), CuPC (copper phthalocyanine), F4-TCNQ (2,3,5,6-tetrafluoro-7,7,8,8-tetracyanoquinodimethane), m-MTDATA (4,4',4''-tris(N-3-methylphenyl-N-phenylamino)triphenylamine), 2T-NATA (4,4',4''-tris(N-(naphthalen-2-yl)-N-phenylamino)triphenylamine), 1-TNATA (4,4',4''-tris(N-(1-naphthyl)-N-phenylamino)triphenylamine), NATA (4,4',4''-tris(N,N-diphenylamino)triphenylamine), PPDN (pyrazino[2,3-f][1,10]phenanthroline-2,3-dicarbonitrile), MeO-TPD (N,N,N',N'-tetrakis(4-methoxyphenyl)benzidine), MeO-spiro-TPD (2,7-bis[N,N-bis(4-methoxyphenyl)amino]-9,9-spirobifluorene), 2,2'-MeO-spiro-TPD (2,2'-bis[N,N-bis(4-methoxyphenyl)amino]-9,9-spirobifluorene), β-NPP(N,N'-di(naphthalen-2-yl)-N,N'-diphenylbenzene-1,4-diamine, NTNPB (N,N'-diphenyl-N,N'-di[4-(N,N-ditolylamino)phenyl]benzidine), or NPNPB (N,N'-diphenyl-N,N'-di[4-(N,N-diphenylamino)phenyl]benzidine).

In relation to the matrix material of the second organic semiconductor layer 104, the abovementioned copper complex is a metallo-organic acceptor assembly. It serves as a p-dopant. The copper complex here may be an isolated molecule. The copper complex is frequently joined via chemical bonds to molecules of the matrix material, as for example, by molecules of the matrix material, as ligands, forming part of the copper complex. The copper atom typically complexes with organic ligands. The organic ligands may form suitable functional groups, allowing connection to take place to form an oligomer or a polymer.

The copper complex may have a unidentate, tridentate or tetradentate ligand. More particularly it may comprise one or more groups $C(=E_1)E_2$, where at least one, or two or more, of the donor atoms $E_1$ and $E_2$ of the ligands, and the copper atoms, undergo complexation. This $C(=E_1)E_2$ group typically has a negative charge. It is also possible for nondeprotonated carboxylic acids or their homologs to serve as ligands of the copper complex. Generally speaking, the ligand of the copper complex contributes negative charge to the complex, by means, for example, of one negative charge per carboxyl group or per homologous carboxyl group.

Where no molecules of the matrix material connect to the copper atoms, the copper complex is a homoleptic complex, in which solely ligands complex with the central copper atom. Such a complex often has a rectangular or linear molecular geometry. This is the case especially if interactions between copper atoms are negligible. Where molecules from the matrix material do connect to the central copper atom, the molecular geometry of the complex takes the form of a pentagonal bipyramid, or the complex acquires a square-pyrimidal molecular geometry. In this case the copper complex is usually an electrically neutral complex.

The copper complex may be either a mononuclear copper complex or a polynuclear copper complex. In a polynuclear copper complex, the ligand may be connected only to one copper atom or to two copper atoms. In this case the ligand, for example, may form a bridge between two copper atoms. Should the ligand be tridentate or polydentate, it may also connect more copper atoms as a bridge. In the case of a polynuclear copper complex it is possible for copper-copper connections to exist between two or more copper atoms. The use of polynuclear copper complexes is particularly advantageous since an organic functional layer doped in this way has a longer lifetime than a functional layer doped with a mononuclear copper complex. This may be explained by destabilization of the complex in the case of charge transport through the functional layer. In the case of polynuclear copper complexes, the effect of the charge transport is distributed not only to one but also to a plurality of copper complexes.

A polynuclear copper complex may have what is called a "paddle-wheel" structure. This is especially true of a copper (II) complex. A paddle-wheel structure is typically adopted in a complex with two metal atoms, where two copper atoms are connected by one or more polydentate ligands in the form of a bridge.

The coordination mode of all of the ligands with respect to the copper atom is frequently almost identical. Accordingly, at least one bidentate or tetradentate axis of rotation with regard to the copper atoms and the ligands is defined by two of the copper atoms of the polynuclear copper complex. Square-planar complexes here often have an at least tetradentate axis of rotation, while linearly coordinated complexes frequently have a bidentate axis of rotation.

The copper complexes described share the feature of being a Lewis acid. A Lewis acid is a compound which acts as an electron pair acceptor. The behavior of the copper complexes as Lewis acid is linked to the molecules of the matrix material incorporating the copper complex as dopant. The molecules of the matrix material generally act as a Lewis base in relation to the Lewis-acidic copper molecules. A Lewis base is an electron pair donor.

The copper atom in the copper complex possesses an open, i.e., further coordination site. A Lewis-basic compound is able to bind to this coordination site—for example, an aromatic ring system, a nitrogen atom, or an amine component, present in the matrix material. This is shown, by way of example, in FIGS. 1 and 2:

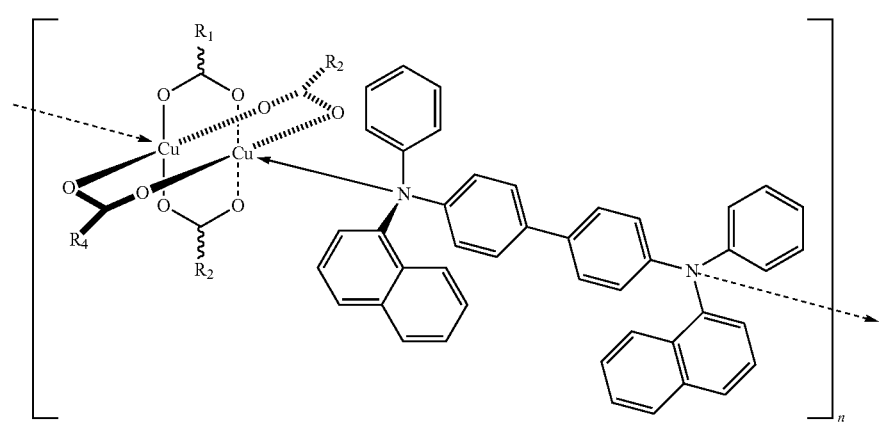

Figure 1

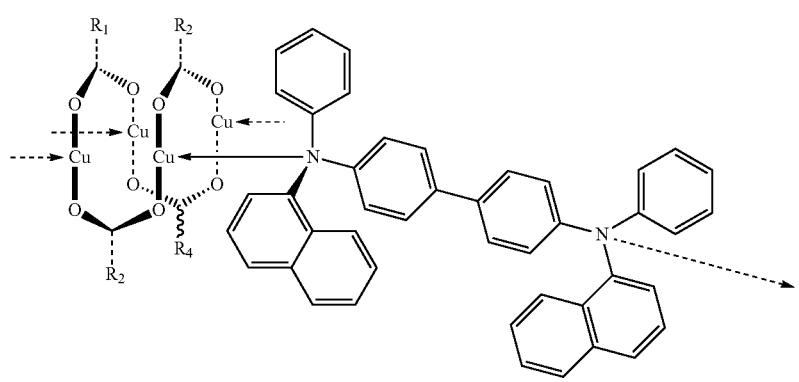

Figure 2

The copper atom of a mononuclear complex, or at least one copper atom of a polynuclear copper complex, may have a +2 oxidation state. The ligands in such complexes are frequently coordinated in a square-planar geometry. Where the copper atom has a +1 oxidation state, the copper atom is frequently linearly coordinated.

Copper complexes with a Cu(II) atom, as a general rule, have a higher hole conductivity than copper complexes with a Cu(I) atom. The latter have a closed-off $d^{10}$ shell. The hole conductivity is caused primarily by the Lewis acid formed by the Cu(I) atoms. Cu(II) complexes, in contrast, have an unfilled $d^9$ configuration, thereby giving rise to oxidation behavior. Partial oxidation increases the hole density. The use of Cu(I) complexes, however, can be advantageous, since Cu(I) complexes are frequently more thermally stable than corresponding Cu(II) complexes.

It is also possible for groups with heteroaromatic ring systems, or a nitrogen atom of an amine component, to coordinate with a copper atom.

The ligand which coordinates to the copper atom may have a group R which features a substituted or unsubstituted hydrocarbon group. The hydrocarbon group may be a linear, branched, or cyclic group. It may have 1-20 carbon atoms. It is for example a methyl or ethyl group. It may also have fused substituents, such as decahydronaphthyl, adamantyl, cyclohexyl, or partly or fully substituted alkyl groups. The substituted or unsubstituted aromatic groups are, for example, phenyl, biphenyl, naphthyl, phenanthryl, benzyl, or a heteroaromatic radical, as for example, a substituted or unsubstituted radical, which may be selected from the heterocycles of FIG. 3:

Figure 3

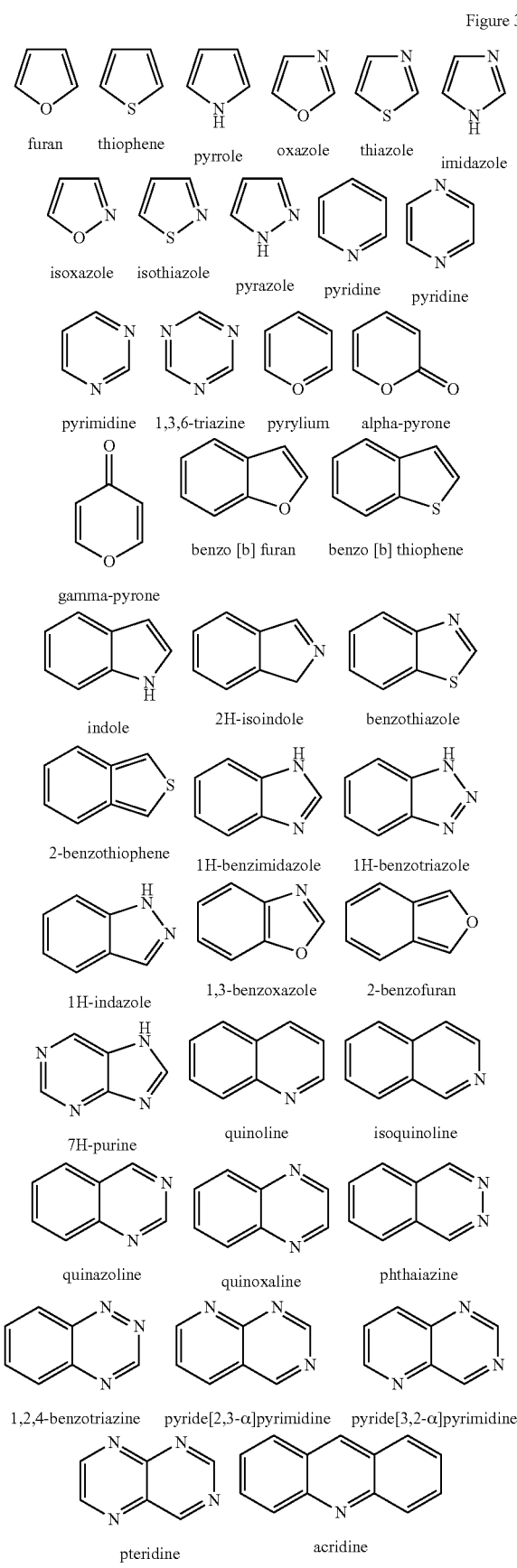

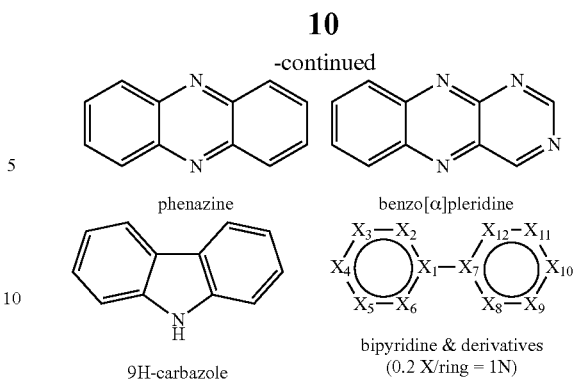

bipyridine & derivatives
(0.2 X/ring = 1N)

The ligand which coordinates to the copper atom may also have a group R which comprises an alkyl group and/or an aryl group. The alkyl and/or aryl group contains at least one electron-withdrawing substituent. The copper complex may likewise comprise one or more types of a carboxylic acid, as a mixed system.

An electron-withdrawing substituent is understood in the present disclosure to be a substituent which the electron density in an atom bonded to the substituent relative to a configuration in which in place of the electron-withdrawing substituent a hydrogen atom bonds to the atom.

An electron-withdrawing group may be selected, for example, from the following group: halogens, such as chlorine or in particular fluorine, nitro groups, cyano groups, or mixtures of these groups. The alkyl group and aryl group may exclusively contain electron-withdrawing substituents, such as the stated electron-withdrawing groups, or hydrogen atoms. If the ligand features an alkyl and/or aryl group having at least one electron-withdrawing substituent, then the electron density on the copper atom or atoms is reduced, thereby increasing the degree of Lewis acidity of the complex.

The ligand here may represent an anion of carbonic acids $CHal_xH_{3-x}COOH$, more particularly $CF_xH_{3-x}COOH$ and $CCl_xH_{3-x}COOH$, where Hal is a halogen atom and x is an integer from 0 to 3. The ligand may also be an anion of carbonic acids $CR'_yHal_xH_{3-x-y}COOH$, where Hal is a halogen atom, x is an integer from 0 to 3, and y is an integer having a value of at least 1. The residue group R' is an alkyl group, a hydrogen atom, or an aromatic group, such as a phenyl group, for example, or any substituent groups described hitherto. It may comprise electron-withdrawing substituents, more particularly the electron-withdrawing substituents described earlier on above. It may also comprise a derivative of benzoic acid with an electron-withdrawing substituent. For example, the ligand may be an anion of the carbonic acid $R'—(CF_2)_n—CO_2H$, where n takes on an integral value of between 1 and 20. For example, a fluorinated, more particularly a perfluorinated, homo- or heteroaromatic compound may be used as a residue group. One example are anions of the fluorinated benzoic acid:

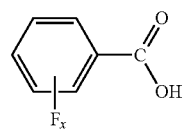

where x adopts an integral value of 1 to 5. More particularly, it is possible for the following substituents, or those in which fluorine has been replaced by chlorine, to bond to the carboxyl group, all of these being strong Lewis acids:

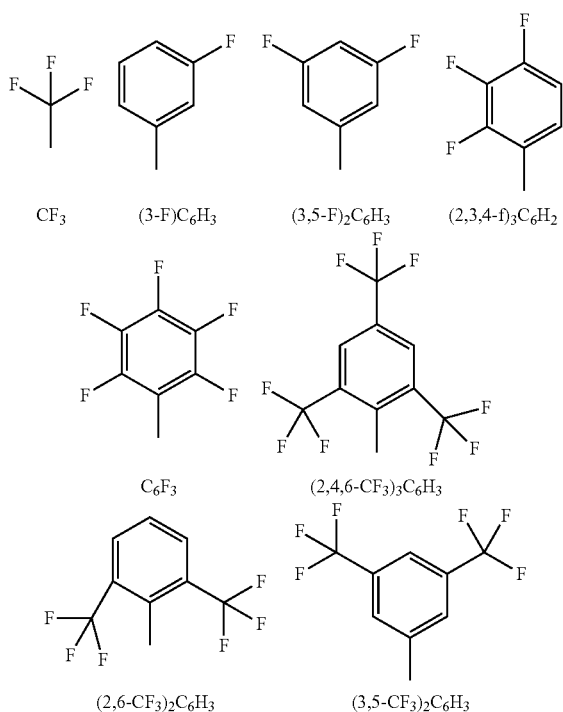

It is possible, furthermore, for anions of the following acid to be used as ligands:

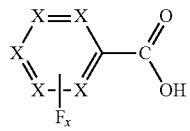

where X may be a nitrogen or may be a carbon atom that bonds, for example, to a hydrogen atom or to a fluorine atom. For example, three of the atoms X may be a nitrogen atom and two may be a C—F bond or C—H bond (as triazine derivatives). It is also possible for anions of the following acid to be used as ligands:

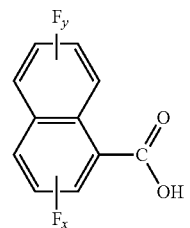

where the naphthyl ring is substituted by 1 to 7 fluorine substituents, so that y=0-4 and x=0-3, with y+x=1-7.

Fluorine and compounds of fluorine as electron-withdrawing substituents are especially advantageous since copper complexes which comprise fluorine atoms can be easily evaporated and deposited in an organic layer during production of the organic light-emitting component. As a further or alternative substituent group, a trifluoromethyl group may be stated.

Electron-Transporting Layer 112

The function of the electron-transporting layer 112 is primarily that of ensuring balanced transport of negative charge carriers into the active layer 110. For this purpose, the electron-transporting layer 112 may feature an n-doped material. For the n-doping it is possible to use metals with a low exit energy, examples being cesium, lithium, or magnesium. Likewise suitable as n-dopant are compounds which comprise these metals—for example, $Cs_2CO_3$, CsF or LiF. These dopants are incorporated in a matrix material. An example of a suitable matrix material is TPBi (1,3,5-tris(1-phenyl-1H-benzimidazol-2-yl)benzene).

Active Layer 110

The active layer 110 has a light-emitting layer which comprises an organic electroluminescent material. In the electroluminescent material, owing to the formation of excitons and in a one subsequent decomposition, the emission of electromagnetic radiation 114 is brought about. The electromagnetic radiation 114 exits through the hole-transporting layer 108 and through the anode 102 from the organic light-emitting component 100.

The selection of the electroluminescent material is an area which is subject to continual ongoing development. Examples of such organic electroluminescent materials include the following:

(i) poly(p-phenylenevinylene) and its derivatives substituted at different positions on the phenylene group;

(ii) poly(p-phenylenevinylene) and its derivatives substituted at different positions on the vinylene group;

(iii) poly(p-phenylenevinylene) and its derivatives substituted at different positions on the phenylene component and also at different positions on the vinylene group;

(iv) polyarylenevinylene, where the arylene may be groups such as, for instance, naphthalene, anthracene, furylene, thienylene, oxadiazole, and the like;

(v) derivatives of polyarylenevinylene, where the arylene may be as in (iv) above and may additionally have substituents at different positions on the arylene;

(vi) derivatives of polyarylenevinylene, where the arylene may be as in (iv) above and may additionally have substituents at different positions on the vinylene;

(vii) derivatives of polyarylenevinylene where the arylene may be as in (iv) above and may additionally have substituents at different positions on the arylene and substituents at different positions on the vinylene;

(viii) copolymers of arylene-vinylene oligomers such as, for instance, those in (iv) (v), (vi), and (vii) with nonconjugated oligomers; and (ix) poly(p-phenylene) and its derivatives substituted at different positions on the phenylene groups, including ladder polymer derivatives such as, for instance, poly(9,9-dialkylfluorene) and the like;

(x) polyarylenes, where the arylene may be groups such as naphthalene, anthracene, furylene, thienylene, oxadiazole, and the like; and their derivatives substituted at different positions on the arylene group;

(xi) copolymers of oligoarylenes such as, for instance, those in (x) with nonconjugated oligomers;

(xii) polyquinoline and its derivatives;

(xiii) copolymers of polyquinoline with p-phenylene, substituted on the phenylene by, for example, alkyl or alkoxy groups in order to acquire solubility; and (xiv) rigid rod polymers such as, for instance, poly(p-phenylene-2,6-benzobisthiazole), poly(p-phenylene-2,6-benzobisoxazole), poly(p-phenylene-2,6-benzimidazole), and their derivatives.

Other organic emitting polymers such as, for instance, those which use polyfluorene include polymers which emit green, red, blue or white light, or their families, copolymers, derivatives, or mixtures thereof. Other polymers include polyspirofluorene-like polymers.

Alternatively it is possible instead of polymers for small organic molecules which emit via fluorescence or via phosphorescence to serve as the organic electroluminescent layer. Examples of small-molecule organic electroluminescent materials include the following (i) tris(8-hydroxyquinolinato)aluminum, (Alq);
(ii) 1,3-bis(N,N-dimethylaminophenyl)-1,3,4-oxidazole (OXD-8);
(iii)-oxo-bis(2-methyl-8-quinolinato)aluminum;
(iv) bis(2-methyl-8-hydroxyquinolinato)aluminum;
(v) bis(hydroxybenzoquinolinato)beryllium (BeQ.sub.2);
(vi) bis(diphenylvinyl)biphenylene (DPVBI); and
(vii) arylamine-substituted distyrylarylene (DSA amine).

The active layer 110 may be a white-emitting layer. This means that it emits electromagnetic radiation 114 in the entire visible spectrum. This may be achieved, for example, by means of stacking of two or more active individual layers, with one color spectrum being generated in each individual layer. It is also conceivable for different emitter materials to be mixed in an active layer 110 in order to generate different color spectra.

The working example uses a copper complex in a charge transport layer of an optoelectronic component with transparent anode contact. This copper complex has at least one ligand with the chemical structure according to formula I:

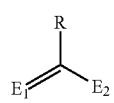

(I)

in which $E_1$ and $E_2$ in each case independently of one another are one of the following elements: oxygen, sulfur, or selenium, and R is selected from the following group: hydrogen or substituted or unsubstituted, branched, linear, or cyclic hydrocarbons.

This copper complex may be used more particularly in a charge transport layer of an inverted or transparent organic light-emitting component. The copper complex may be incorporated as a p-dopant in a matrix material. As a result of the properties already described for the copper complex, it is possible to provide a component having high efficiency, good voltage stability, and long lifetime. Through the use of the copper complex in a p-doped layer, additionally, an initially strong drop in luminance in the event of first commissioning of the component (also known as initial drop) is avoided. It is also possible in particular to achieve for the component a luminance decline that is approximately linear as a function of aging.

Through the use of the copper complex, it is further possible for TCO materials to be applied as an individual layer or as part of a composite electrode, by means of sputtering technologies or with the aid of atomic layer deposition (ALD), as a top anode to the component. By this means it is possible to produce an organic light-emitting component having a low level of dependence on the perspective of the emission colors and having good efficiency. Additionally, it is possible to fabricate components of large surface area where there is no need for metallic conductor tracks, such as those known as busbars, for example. Moreover, transparent organic light-emitting components having a transparency for ambient light of more than 50% through more than 60% can be produced.

Moreover, the use of the readily available copper complexes as p-dopant results in a considerable potential for cost saving, since in particular the p-doped layers as a general rule account for a considerable proportion of the overall thickness of an organic layer stack in an organic light-emitting component.

Second Working Example of an Organic Light-Emitting Component

Figure 2:
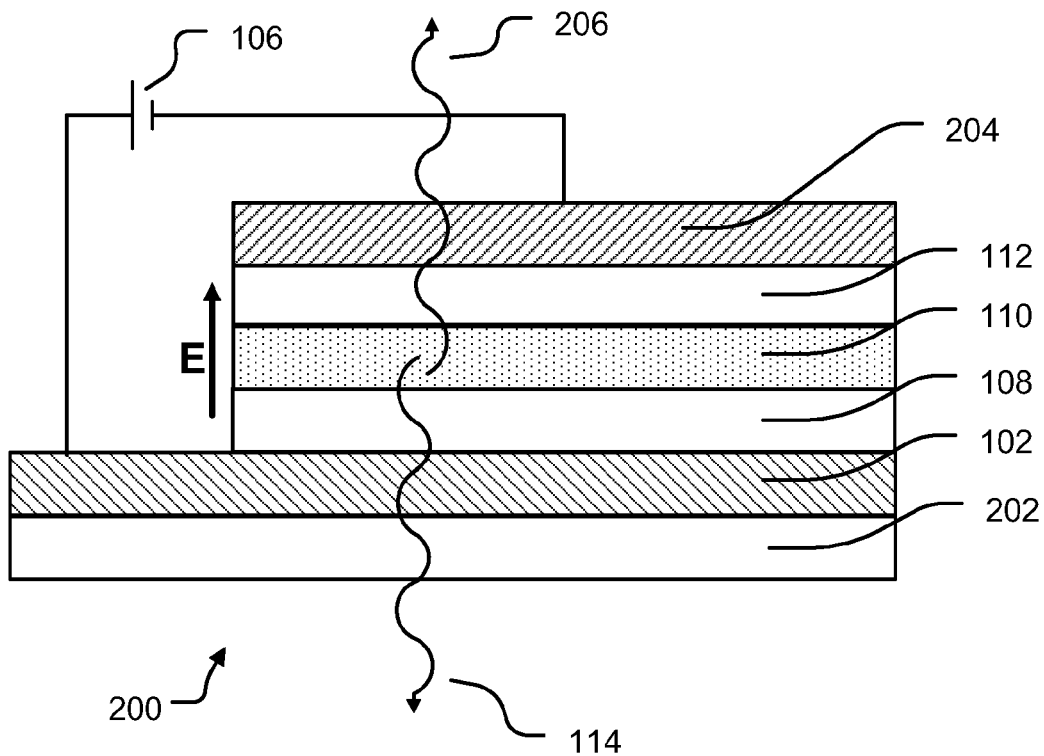
FIG. 2 shows a schematic representation of a second working example of an organic light-emitting component.

FIG. 2 shows a diagrammatic representation of a second first working example of an organic light-emitting component 200. In addition to the configuration of the first working example, described with reference to FIG. 1, the organic light-emitting component 200 has a substrate 202 which bears the electrodes and the organic layer stack. The substrate 202 is not a necessary constituent of the organic light-emitting component 200. It serves for mechanical stabilization of the layer stack. It may also be part of an encapsulation, not shown in the figures, of the organic light-emitting component 200. A substrate 202 may also be provided in connection with the first or other working examples of the organic light-emitting component 100. It may also be provided on the cathode 104. In that case the component is referred to as an inverted OLED.

Where the substrate 202 is covered by the anode 202, it is transparent in the spectral range of the radiation emitted by the active layer 110. To obtain mechanical stability in the organic light-emitting component 200 it is possible to use materials, such as glass, sapphire, or else flexible films, such as plastic. Use may also be made of transparent semiconductor supports, such as SiC, GaN, InN, or similar materials. Where the substrate 202 is mounted on a nontransparent cathode 104, it is possible for mirrored materials to be used for the substrate, examples being materials having good thermal conductivity.

The organic light-emitting component 200 has a transparent cathode 204, i.e., the cathode 204 has a high transmission coefficient for radiation emitted from the active layer 110. To this end the cathode 204 may be formed of a material similar to that of the anode 102. The essential factor is a high mobility of electrons in the cathode material and hence a high electrical conductivity. Furthermore, the electron-transporting layer 108 may likewise be of transparent configuration. Materials suitable for achieving this are familiar to the skilled person. In this way it is possible for a fraction of the radiation 206 emitted in the active layer 110 to be outcoupled by the cathode 104. The organic light-emitting component 200 therefore emits radiation via the anode 102 and via the cathode 104. Given the materials used in the organic light-emitting component 200 all have a high transmission coefficient, the organic light-emitting component 200 appears transparent when not in operation. It is also referred to as a transparent OLED.

In the fabrication of a transparent OLED, specifically, the copper complex described is of particular advantage. Because in many architectures the HTL accounts for a considerable proportion of the thickness of the organic layer stack, the high charge transport layer transparency achieved as a result of the use of the copper complex proves essential for high transparency in the OLED as a whole. The copper complex, moreover, can also be employed in other p-doped functional layers of the organic light-emitting component.

Concluding Observation

In order to illustrate the underlying concept, the organic light-emitting component has been described with a number of working examples. These working examples are not confined to specific combinations of features. Although a number of features and configurations have been described only in connection with one particular working example or with individual working examples, they can in each case be combined with other features from other working examples. It is also possible for particular configurations or individual features shown in working examples to be omitted or to be added, provided that the general technical teaching remains realized.

The invention claimed is:

1. An organic, light-emitting component comprising:
an active layer configured to emit electromagnetic radiation;
an anode and a cathode;
an organic charge transport layer disposed between the active layer and the anode, the organic charge transport layer configured for charge carrier transport from the anode into the active layer;
an electron transport layer disposed between the active layer and the cathode, wherein the electron transport layer comprises an n-doped material,
wherein the electromagnetic radiation emitted from the active layer is outcoupled from the organic, light-emitting component via the anode, and
wherein the organic charge transport layer comprises a copper complex which has at least one ligand with the chemical structure according to formula I:

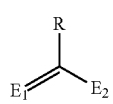

where $E_1$ and $E_2$ are each, independently of one another, one of the following elements: oxygen, sulfur, or selenium, and where R is selected from the group consisting of: hydrogen or substituted or unsubstituted, branched, linear, or cyclic hydrocarbons.

2. The organic, light-emitting component according to claim 1, wherein the copper complex is a copper(I)pentafluorobenzoate.

3. The organic, light-emitting component according to claim 1, wherein the copper complex is incorporated as dopant in a matrix material.

4. The organic, light-emitting component according to claim 1, wherein the matrix material comprises 1-TNATA {4,4',4"-tris(N-(1-naphthyl)-N-phenylamino)triphenylamine.

5. The organic, light-emitting component according to claim 3, wherein the organic charge transport layer has a dopant concentration of 0.1 to 50 weight percent.

6. The organic, light-emitting component according to claim 3, wherein the organic charge transport layer has a dopant concentration of more than 1 weight percent.

7. The organic, light-emitting component according to claim 3, wherein the organic charge transport layer has a dopant concentration of more than 10 weight percent.

8. The organic, light-emitting component according to claim 3, wherein the organic charge transport layer has a dopant concentration of more than approximately 5 weight percent.

9. The organic, light-emitting component according to claim 3, wherein the charge transport layer has a doping gradient from the anode to the active layer.

10. The organic, light-emitting component according to claim 9, wherein the doping of the charge transport layer decreases toward the active layer.

11. The organic, light-emitting component according to claim 1, wherein the cathode is transparent in the spectral range of the electromagnetic radiation emitted in the active layer.

12. A method for manufacturing an organic, light-emitting component, the method comprising:
forming a charge transporting layer on an anode, wherein the anode is transparent;
forming an active layer on the charge transporting layer; and
forming an electron transporting layer on the active layer,
wherein the active layer is configured to emit electromagnetic radiation,
wherein the electron transport layer comprises an n-doped material,
wherein a copper complex in applied to the charge transport layer of the optoelectronic component,
wherein the copper complex has at least one ligand with the chemical structure according to formula I:

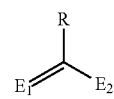

where $E_1$ and $E_2$ are each, independently of one another, one of the following elements: oxygen, sulfur, or selenium, and where R is selected from the group consisting of: hydrogen or substituted or unsubstituted, branched, linear, or cyclic hydrocarbons.

13. An organic, light-emitting component comprising:
an active layer configured to emit electromagnetic radiation;
an anode; and
an organic charge transport layer disposed between the active layer and the anode, the organic charge transport layer configured for charge carrier transport from the anode into the active layer,
wherein the electromagnetic radiation emitted from the active layer is outcoupled from the organic, light-emitting component via the anode, and
wherein the organic charge transport layer comprises a copper complex which has at least one ligand with the chemical structure according to formula I:

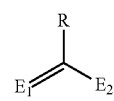

where $E_1$ and $E_2$ are each, independently of one another, one of the following elements: oxygen, sulfur, or selenium, and where R is selected from the group consisting of: hydrogen or substituted or unsubstituted, branched, linear, or cyclic hydrocarbons, wherein the charge transport layer has a doping gradient from the anode to the active layer.

* * * * *

UNITED STATES PATENT AND TRADEMARK OFFICE
CERTIFICATE OF CORRECTION

PATENT NO. : 9,520,575 B2
APPLICATION NO. : 13/993662
DATED : December 13, 2016
INVENTOR(S) : Erwin Lang et al.

It is certified that error appears in the above-identified patent and that said Letters Patent is hereby corrected as shown below:

In Column 15, Line 56, Claim 4, delete "claim 1" and insert --claim 3--.

Signed and Sealed this
Fifth Day of September, 2017

Joseph Matal
*Performing the Functions and Duties of the*
*Under Secretary of Commerce for Intellectual Property and*
*Director of the United States Patent and Trademark Office*